United States Patent
Yang

(10) Patent No.: US 11,935,605 B2
(45) Date of Patent: Mar. 19, 2024

(54) METHOD FOR PREPARING SEMICONDUCTOR DEVICE INCLUDING AN ELECTRONIC FUSE CONTROL CIRCUIT

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 387 days.

(21) Appl. No.: 17/517,525

(22) Filed: Nov. 2, 2021

(65) Prior Publication Data
US 2023/0139833 A1 May 4, 2023

(51) Int. Cl.
| | | |
|---|---|---|
| H01L 21/66 | (2006.01) | |
| G11C 17/16 | (2006.01) | |
| G11C 17/18 | (2006.01) | |
| G11C 29/00 | (2006.01) | |
| H01L 23/525 | (2006.01) | |

(52) U.S. Cl.
CPC ............ *G11C 17/18* (2013.01); *G11C 17/16* (2013.01); *G11C 29/006* (2013.01); *G11C 29/789* (2013.01); *H01L 23/5252* (2013.01); *H01L 22/14* (2013.01); *H01L 23/5256* (2013.01)

(58) Field of Classification Search
CPC ....... G11C 17/16; G11C 17/18; G11C 29/006; G11C 29/789; H01L 22/14; H01L 23/5252; H01L 23/5256
See application file for complete search history.

(56) References Cited

U.S. PATENT DOCUMENTS

| | | |
|---|---|---|
| 8,599,635 B2 | 12/2013 | Kim et al. |
| 2007/0127283 A1 | 6/2007 | Gosmain et al. |
| 2012/0161294 A1* | 6/2012 | Hopper .................. H01L 22/20 |
| | | 257/E21.531 |
| 2017/0140835 A1 | 5/2017 | Chung |

FOREIGN PATENT DOCUMENTS

TW          201239887 A        10/2012

OTHER PUBLICATIONS

Office Action dated on Jun. 9, 2023 related to Taiwanese Application No. 111102419.

* cited by examiner

*Primary Examiner* — Daniel P Shook
(74) *Attorney, Agent, or Firm* — Xuan Zhang

(57) ABSTRACT

The present application discloses a method for preparing a semiconductor device including an electronic fuse control circuit. The method includes providing a chip including an electronic fuse control circuit, wherein the electronic fuse control circuit includes a program voltage pad, a fuse element, a latch, a plurality of resistor selection pads, and a plurality of bonding option units. The method further includes providing a substrate including a first voltage bonding pad and a plurality of second voltage bonding pads, disposing the chip on the substrate, bonding the first voltage bonding pad to the program voltage pad, and bonding at least one of the plurality of second voltage bonding pads to at least one of the plurality of resistor selection pads.

6 Claims, 12 Drawing Sheets

METHOD FOR PREPARING SEMICONDUCTOR DEVICE INCLUDING AN ELECTRONIC FUSE CONTROL CIRCUIT

TECHNICAL FIELD

The present disclosure relates to a method for preparing an electronic fuse control circuit, and more particularly, to a method for preparing an electronic fuse control circuit providing different bonding options.

DISCUSSION OF THE BACKGROUND

An antifuse is one type of electronic fuse (eFuse) and has been adopted in one-time programmable (OTP) non-volatile memories. FIG. 1 shows an antifuse AF1. As shown in FIG. 1, a structure of the antifuse AF1 is similar to that of a transistor; the antifuse AF1 includes a gate G1 and active regions A1. In such case, a resistance between the gate G1 and an active region A1 is rather high due to a gate oxide of the gate G1. However, when a program voltage VH is applied to the gate G1 and a ground voltage is applied to the active region A1, a resulting high voltage applied to the antifuse AF1 breaks down the gate oxide of the gate G1, thereby generating a low resistance path between the gate G1 and the active region A1. Consequently, the antifuse AF1 is programmed.

Since a resistance of the antifuse AF1 is altered significantly when the antifuse AF1 is programmed, a system can identify whether the antifuse AF1 has been programmed or not by detecting the resistance of the antifuse AF1. For example, a reference resistor may be adopted for voltage division with the antifuse AF1, so that a condition of the antifuse AF1 can be identified by the resulting divisional voltage. However, due to variations during manufacturing of the antifuses, resistances of different antifuses may vary from each other. For example, in a general case, the resistance of an antifuse may be greater than 5000 kiloohm before the antifuse is programmed, and may be less than 400 kiloohm after the antifuse is programmed. However, resistances of some antifuses may be less than 1500 kiloohm before the antifuse is programmed, while resistances of some other antifuses may be greater than 800 kiloohm even after the antifuse is programmed. In such case, the reference resistor designated for one antifuse may not be able to correctly identify the condition of another antifuse. As a result, additional manufacturing processes may be required to replace the reference resistor, thereby increasing cost and reducing manufacturing efficiency.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides an electronic fuse control circuit. The electronic fuse control circuit includes a program voltage pad, a fuse element, a latch, an operation switch unit, a plurality of resistor selection pads, and a plurality of bonding option units. The program voltage pad is configured to receive a program voltage. The fuse element includes a first terminal coupled to the program voltage pad, and a second terminal. The latch includes an input terminal and an output terminal. The operation switch unit is configured to form an electrical connection between the second terminal of the fuse element and a ground terminal during a program operation, and configured to form an electrical connection between the second terminal of the fuse element and the input terminal of the latch during a read operation. Each of the plurality of bonding option units includes a resistor and a selection switch coupled in series between the input terminal of the latch and a corresponding resistor selection pad of the plurality of resistor selection pads.

In some embodiments, the fuse element is an antifuse.

In some embodiments, the resistors of the plurality of bonding option units have different resistances.

In some embodiments, the electronic fuse control circuit further includes a read switch including a first terminal coupled to the first terminal of the fuse element, a second terminal coupled to the ground terminal, and a control terminal configured to receive a read control signal.

In some embodiments, the operation switch unit includes a first switch, a second switch, and a third switch. The first switch includes a first terminal coupled to the second terminal of the fuse element, a second terminal, and a control terminal configured to receive a read-and-program control signal. The second switch includes a first terminal coupled to the second terminal of the first switch, a second terminal coupled to the ground terminal, and a control terminal configured to receive a program control signal. The third switch includes a first terminal coupled to the second terminal of the first switch, a second terminal coupled to the input terminal of the latch, and a control terminal configured to receive the read control signal.

In some embodiments, the latch further includes a first inverter and a second inverter. The first inverter includes an input terminal coupled to the input terminal of the latch, and an output terminal coupled to the output terminal of the latch. The second inverter includes an input terminal coupled to the output terminal of the latch, and an output terminal coupled to the input terminal of the latch.

In some embodiments, at least one of the plurality of resistor selection pads receives a read voltage during the read operation, wherein the read voltage is less than the program voltage.

Another aspect of the present disclosure provides a semiconductor device. The semiconductor device includes a chip and a substrate. The chip includes an electronic fuse control circuit, and the electronic fuse control circuit includes a program voltage pad, a fuse element, a latch, an operation switch unit, a plurality of resistor selection pads, and a plurality of bonding option units. The program voltage pad is configured to receive a program voltage. The fuse element includes a first terminal coupled to the program voltage pad, and a second terminal. The latch includes an input terminal and an output terminal. The operation switch unit is configured to form an electrical connection between the second terminal of the fuse element and a ground terminal during a program operation, and configured to form an electrical connection between the second terminal of the fuse element and the input terminal of the latch during a read operation. Each of the plurality of bonding option units includes a resistor and a selection switch coupled in series between the input terminal of the latch and a corresponding resistor selection pad of the plurality of resistor selection pads. The substrate includes a first voltage bonding pad and a plurality of second voltage bonding pads. The first voltage bonding pad is bonded to the program voltage pad, and at least one of the plurality of second voltage bonding pads is bonded to at least one of the plurality of resistor selection pads.

In some embodiments, the fuse element is an antifuse.

In some embodiments, the resistors of the plurality of bonding option units have different resistances.

In some embodiments, the electronic fuse control circuit further includes a read switch including a first terminal coupled to the first terminal of the fuse element, a second terminal coupled to the ground terminal, and a control terminal configured to receive a read control signal.

In some embodiments, the operation switch unit includes a first switch, a second switch, and a third switch. The first switch includes a first terminal coupled to the second terminal of the fuse element, a second terminal, and a control terminal configured to receive a read-and-program control signal. The second switch includes a first terminal coupled to the second terminal of the first switch, a second terminal coupled to the ground terminal, and a control terminal configured to receive a program control signal. The third switch includes a first terminal coupled to the second terminal of the first switch, a second terminal coupled to the input terminal of the latch, and a control terminal configured to receive the read control signal.

In some embodiments, the latch further includes a first inverter and a second inverter. The first inverter includes an input terminal coupled to the input terminal of the latch, and an output terminal coupled to the output terminal of the latch. The second inverter includes an input terminal coupled to the output terminal of the latch, and an output terminal coupled to the input terminal of the latch.

In some embodiments, a resistor selection pad that is bonded to one of the plurality of second voltage bonding pads is configured to receive a read voltage during the read operation, wherein the read voltage is less than the program voltage.

Another aspect of the present disclosure provides a method of forming a semiconductor device. The method includes providing a chip including an electronic fuse control circuit, wherein the electronic fuse control circuit includes a program voltage pad, a fuse element, a latch, a plurality of resistor selection pads, and a plurality of bonding option units. The program voltage pad is coupled to a first terminal of the fuse element, and each of the plurality of bonding option units includes a resistor and a selection switch coupled in series between an input terminal of the latch and a corresponding resistor selection pad of the plurality of resistor selection pads. The method further includes providing a substrate including a first voltage bonding pad and a plurality of second voltage bonding pads, disposing the chip on the substrate, bonding the first voltage bonding pad to the program voltage pad, and bonding at least one of the plurality of second voltage bonding pads to at least one of the plurality of resistor selection pads.

In some embodiments, the method further includes performing a test operation according to a condition of the fuse element to determine the at least one of the plurality of resistor selection pads to be bonded to the at least one of the plurality of second voltage bonding pads.

In some embodiments, performing the test operation according to the condition of the fuse element to determine the at least one resistor selection pad to be bonded to the at least one second voltage bonding pad includes performing a read operation on the fuse element with a first bonding option unit of the plurality of bonding option units to generate a first reading result, and, when the first reading result is determined to be negative, performing the read operation on the fuse element with a second bonding option unit of the plurality of bonding option units to generate a second reading result.

In some embodiments, when the second reading result is determined to be affirmative, performing the test operation further includes determining a resistor selection pad coupled to the second bonding option unit that is to be bonded to the at least one second voltage bonding pad.

In some embodiments, performing the read operation on the fuse element with the first bonding option unit of the plurality of bonding option units to generate the first reading result includes applying a read voltage to a resistor selection pad that is coupled to the first bonding option unit, turning on a selection switch of the first bonding option unit, pulling the first terminal of the fuse element to a ground voltage, and coupling a second terminal of the fuse element to the input terminal of the latch.

In some embodiments, before the read operation is performed on the fuse element, performing the test operation further includes performing a program operation on the fuse element by applying a program voltage to the program voltage pad and applying a ground voltage to a second terminal of the fuse element.

The electronic fuse control circuits, the semiconductor devices, and the methods for forming the semiconductor devices provided by the embodiments allow a user to select a proper bonding option unit during a wafer probing process, and further allow the user to subsequently connect the selected bonding option unit to a bonding pad of a substrate during a packaging process. Therefore, even though a resistance of a fuse element cannot be predicted before a chip is manufactured, a manufacturer is able to select the proper bonding option unit having suitable resistance after the chip is manufactured so as to ensure accuracy of read operations and avoid additional manufacturing processes required to change a reference resistor in the prior art.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
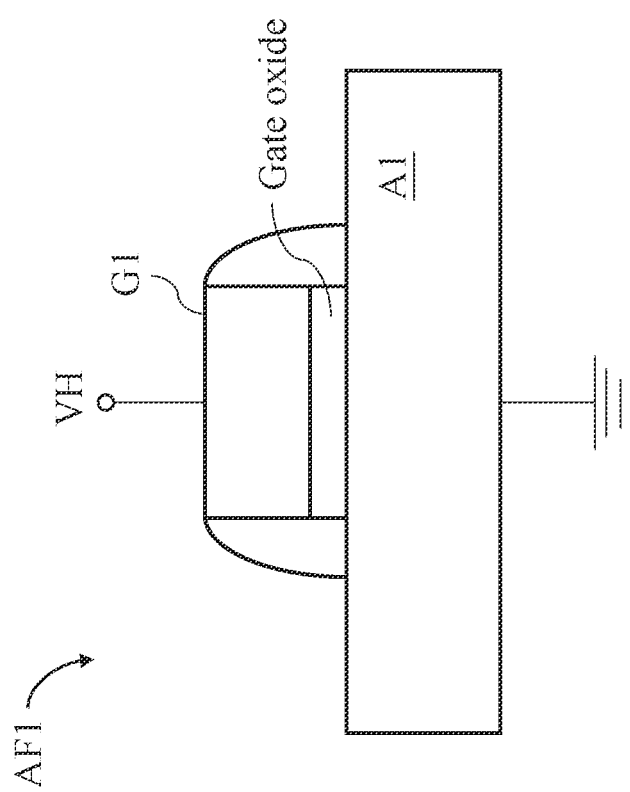
FIG. 1 shows an antifuse.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar" or "coplanar," as used herein when referring to orientation, layout, location, shapes, sizes, amounts or other measures do not necessarily mean an identical orientation, layout, location, shape, size, amount or other measure, but are intended to encompass nearly identical orientation, layout, location, shapes, sizes, amounts or other measures within acceptable variations that may occur, for example, due to manufacturing processes. The term "substantially" may be used herein to reflect this meaning. For example, items described as "substantially the same," "substantially equal" or "substantially coplanar" may be exactly the same, equal or coplanar, or may be the same, equal or coplanar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

Figure 2:
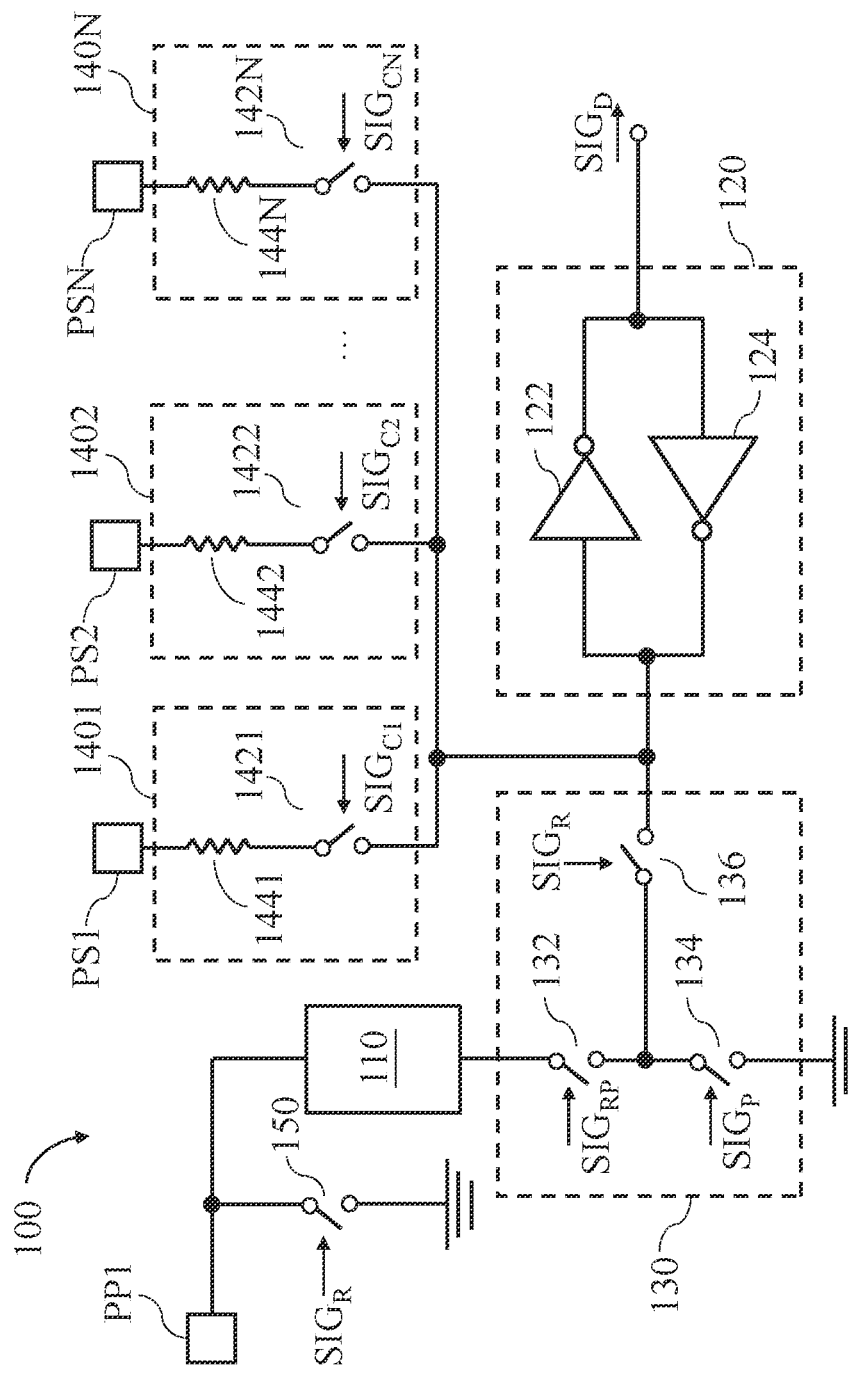
FIG. 2 shows an electronic fuse control circuit according to one embodiment of the present disclosure.

FIG. 2 shows an electronic fuse control circuit 100 according to one embodiment of the present disclosure. The electronic fuse control circuit 100 includes a program voltage pad PP1, a plurality of resistor selection pads PS1 to PSN, a fuse element 110, a latch 120, an operation switch unit 130, and a plurality of bonding option units 1401 to 140N, where N is a positive integer greater than 1.

The fuse element 110 includes a first terminal and a second terminal, and the first terminal of the fuse element 110 is coupled to the program voltage pad PP1. In the present embodiment, the fuse element 110 can be an antifuse and can have the same structure as the antifuse AF1 shown in FIG. 1. In such case, the first terminal of the fuse element 110 can be referred to as the gate G1 of the antifuse AF1, and the second terminal of the fuse element 110 can be referred to as the active region A1 of the antifuse AF1.

The latch 120 includes an input terminal and an output terminal. The operation switch unit 130 is coupled to the second terminal of the fuse element 110, the input terminal of the latch 120, and a ground terminal. In the present embodiment, the operation switch unit 130 can form an electrical connection between the second terminal of the fuse element 110 and the ground terminal, or an electrical connection between the second terminal of the fuse element 110 and the input terminal of the latch 120, according to the operations to be performed.

Furthermore, each of the bonding option units 1401 to 140N includes a resistor and a selection switch coupled in series between the input terminal of the latch 120 and a corresponding resistor selection pad of the resistor selection pads PS1 to PSN. For example, the bonding option unit 1401 can be coupled to the resistor selection pad PS1, and the bonding option unit 140N can be coupled to the resistor selection pad PSN. In addition, in the present embodiment, resistors 1441 to 144N of the bonding option units 1401 to 140N can have different resistances, and the selection switches 1421 to 142N can be controlled respectively and correspondingly by control signals $SIG_{C1}$ to $SIG_{CN}$.

The latch 120 includes a first inverter 122 and a second inverter 124. The first inverter 122 includes an input terminal coupled to the input terminal of the latch 120, and an output terminal coupled to the output terminal of the latch 120. The second inverter 124 includes an input terminal coupled to the output terminal of the latch 120, and an output terminal coupled to the input terminal of the latch 120.

In addition, the operation switch unit 130 includes a first switch 132, a second switch 134, and a third switch 136. The first switch 132 includes a first terminal coupled to the second terminal of the fuse element 110, a second terminal, and a control terminal for receiving a read-and-program control signal $SIG_{RP}$. The second switch 134 includes a first terminal coupled to the second terminal of the first switch 132, a second terminal coupled to the ground terminal, and a control terminal for receiving a program control signal $SIG_P$. The third switch 136 includes a first terminal coupled to the second terminal of the first switch 132, a second terminal coupled to the input terminal of the latch 120, and a control terminal for receiving a read control signal $SIG_R$.

In the present embodiment, the electronic fuse control circuit 100 may further include a read switch 150. The read switch 150 includes a first terminal coupled to the first terminal of the fuse element 110, a second terminal coupled to the ground terminal, and a control terminal for receiving the read control signal $SIG_R$. In some embodiments, the switches 132, 134, 136 and 150 can be, for example but not limited thereto, formed by transistors. In the present embodiment, the switches 132, 134, 136 and 150 can be implemented by N-type metal-oxide-semiconductor (MOS) transistors.

Figure 3:
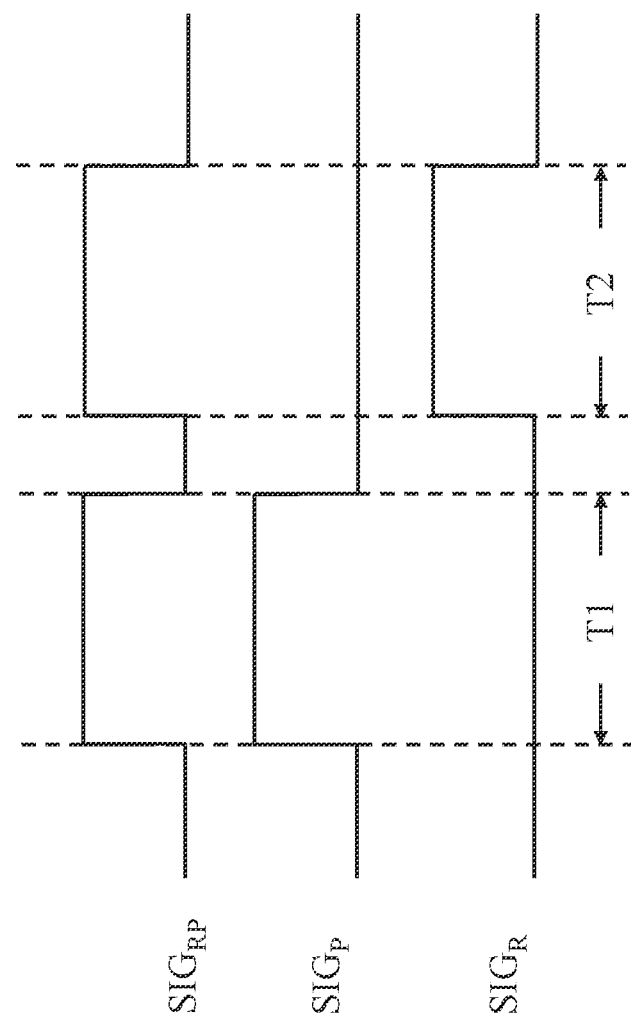
FIG. 3 shows a timing diagram of control signals received by the electronic fuse control circuit in FIG. 2 during a program operation and a read operation.
Figure 4:
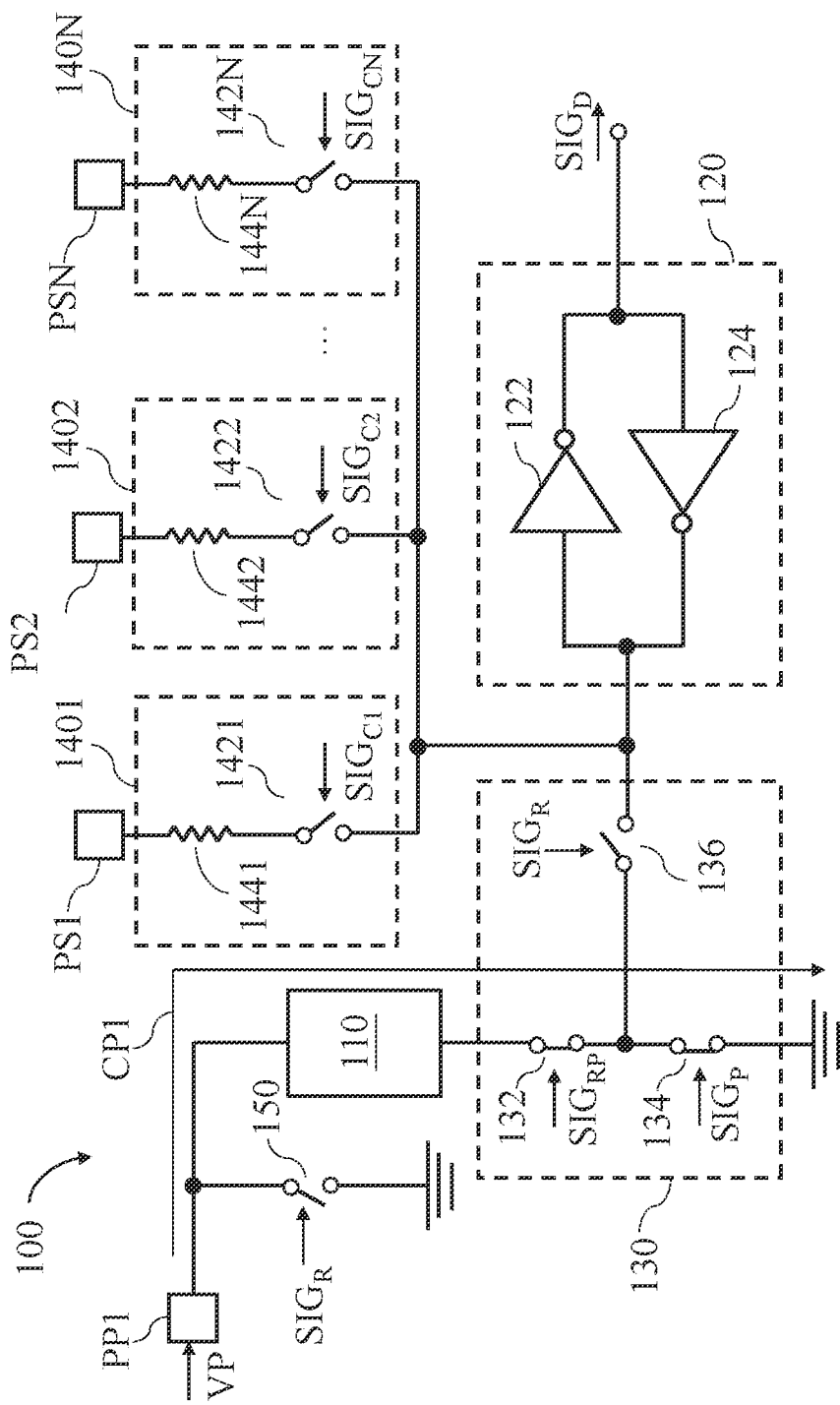
FIG. 4 shows the electronic fuse control circuit in FIG. 2 during the program operation.

FIG. 3 shows a timing diagram of the control signals received by the electronic fuse control circuit 100 during a program operation and a read operation. As shown in FIG. 3, the program operation is performed during period T1 and the read operation is performed during period T2. FIG. 4 shows the electronic fuse control circuit 100 during the program operation.

During the period T1, the program control signal $SIG_P$ and the read-and-program control signal $SIG_{RP}$ are at a logic high voltage level while the read control signal $SIG_R$ is at a logic low voltage level. In such case, the first switch 132 and the second switch 134 of the operation switch unit 130 are turned on, and the third switch 136 and the read switch 150 are turned off.

Furthermore, as shown in FIG. 4, the program voltage pad PP1 can receive the program voltage VP during the program operation. Since the first switch 132 and the second switch 134 of the operation switch unit 130 are turned on, the electrical connection between the second terminal of the fuse element 110 and the ground terminal is formed so as to pull the second terminal of the fuse element 110 down to the ground voltage. In the present embodiment, the program voltage VP can be a high voltage that is high enough to blow the fuse element 110. Therefore, a gate oxide of the fuse element 110 can be ruptured by the high voltage applied to the fuse element 110, thereby creating a low resistance path between the first terminal and the second terminal of the fuse element 110. As a result, a current path CP1 is formed from the program voltage pad PP1 to the ground terminal through the fuse element 110, the first transistor 132 and the second transistor 134, as shown in FIG. 4.

Figure 5:
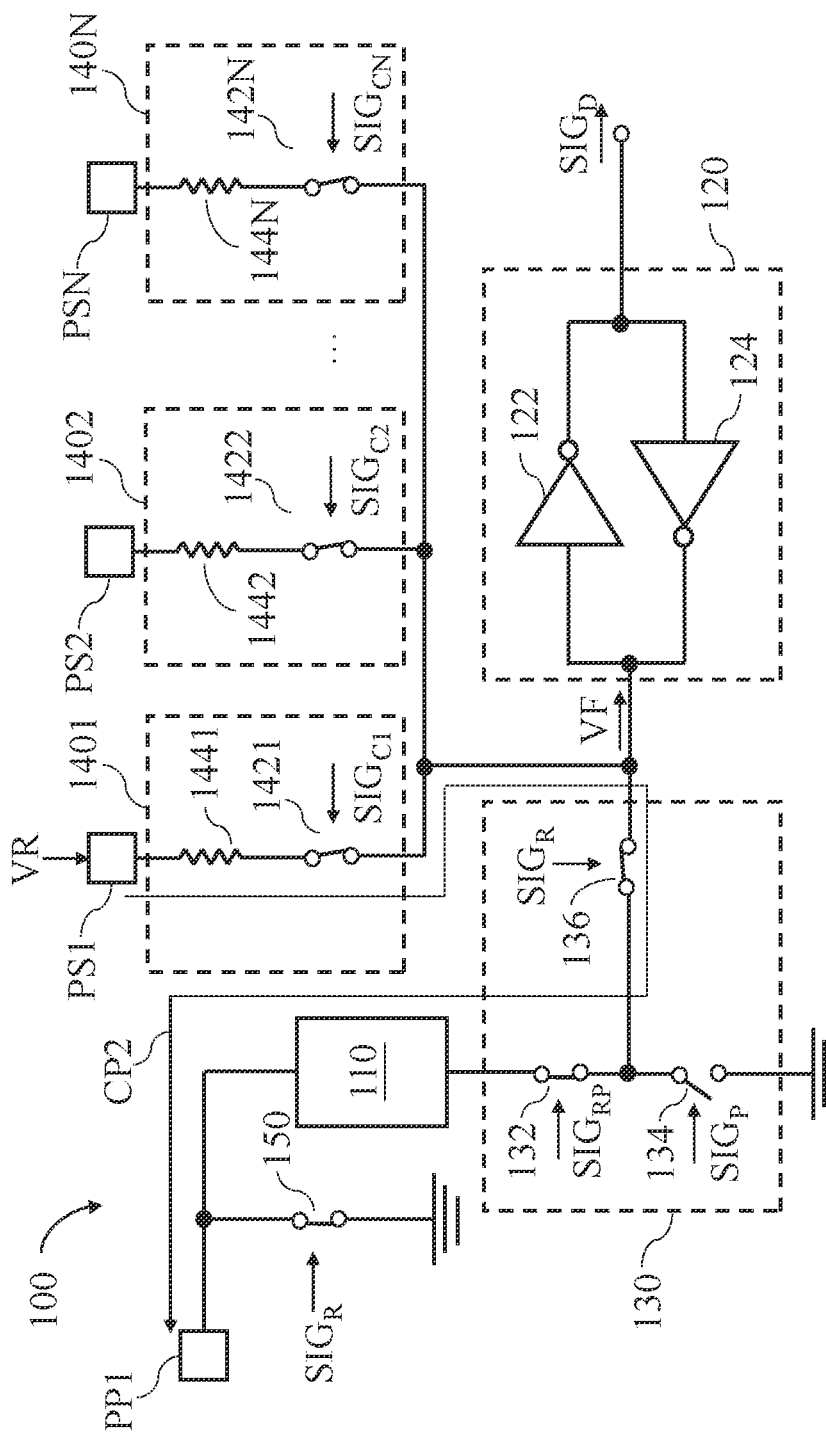
FIG. 5 shows the electronic fuse control circuit in FIG. 2 during the read operation.

After the program operation, a read operation is performed in period T2 as shown in FIG. 3. FIG. 5 further shows the electronic fuse control circuit 100 during the read operation. During the read operation, the program control signal $SIG_P$ is at the logic low voltage level, and the read-and-program control signal $SIG_{RP}$ and the read control signal $SIG_R$ are at the logic high voltage level. In such case, the second switch 134 is turned off, and the first switch 132, the third switch 136 and the read switch 150 are turned on. Therefore, the electrical connection between the second terminal of the fuse element 110 and the input terminal of the latch 120 is formed.

Furthermore, in the embodiment shown in FIG. 5, the selection switches 1421 to 142N of the bonding option units 1401 to 140N are turned on during the read operation. In addition, since the resistor selection pad PS1 is bonded to the external bonding pad and receives a read voltage VR during the read operation, the bonding option unit 1401 is adopted to perform the read operation in the present embodiment. As a result, a current path CP2 can be formed from the resistor selection pad PS1 to the ground terminal through the resistor 1441 of the bonding option unit 1401, the third transistor 136, the first transistor 132, the fuse element 110, and the read transistor 150, as shown in FIG. 5. Thus, the latch 120 can sense a voltage VF at the second terminal of the fuse element 110 and output a data signal $SIG_D$ accordingly. In some embodiments, to prevent the fuse element 110 from being blown by the read voltage VR, the read voltage VR should be less than the program voltage VP. For example, the program voltage VP can be 6V, and the read voltage VR can be 1.2V. It should be noted that in some other embodiments, other bonding option units may also be adopted to perform the read operation. In such cases, the resistor selection pads coupled to the adopted bonding option units will be bonded to the external bonding pads for receiving the read voltage VR during the read operation.

Figure 6:
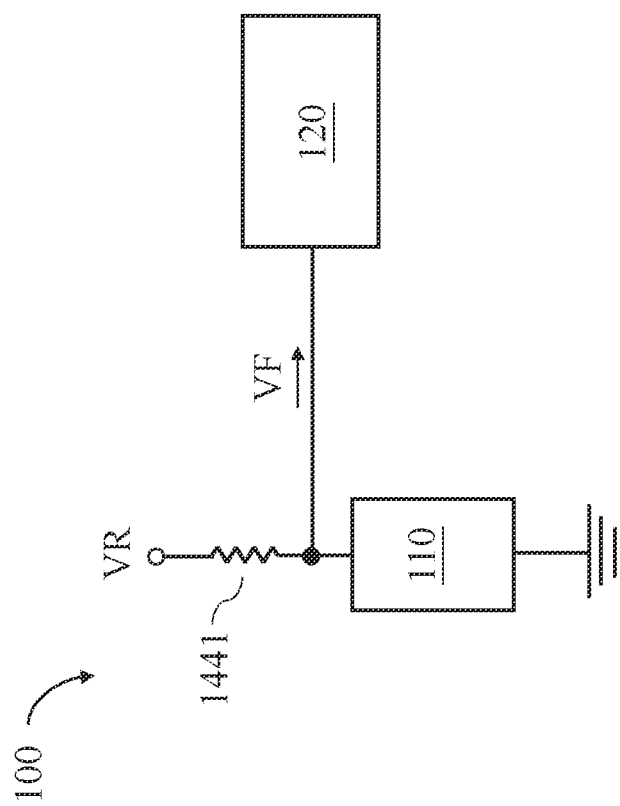
FIG. 6 shows an equivalent circuit of the electronic fuse control circuit in FIG. 2 during the read operation.

In the present embodiment, the voltage VF at the second terminal of the fuse element 110 is a divisional voltage of the read voltage VR produced according to the ratio of the resistance of the resistor 1441 to the resistance of the fuse element 110. FIG. 6 shows an equivalent circuit of the electronic fuse control circuit 100 during the read operation. As shown in FIG. 6, the voltage VF at the second terminal of the fuse element 110 can be represented by Formula (1).

$$VF = VR\left(\frac{R_{110}}{R_{1441} + R_{110}}\right) \qquad \text{Formula (1)}$$

In Formula (1), $R_{110}$ represents a resistance of the fuse element 110, and $R_{1441}$ represents a resistance of the resistor 1441. In some embodiments, the latch 120 will latch the data signal $SIG_D$ to the logic low voltage level if the voltage VF is greater than 0.6V, and the latch 120 will latch the data signal $SIG_D$ to the logic high voltage level if the voltage VF is less than 0.6V. In such case, to properly identify the status of the fuse element 110 according to the voltage VF, the resistance $R_{1441}$ of the resistor 1441 should be rather close to the resistance $R_{110}$ of the fuse element 110 before the fuse element 110 is programmed so that the variation of the resistance $R_{110}$ of the fuse element 110 can be significantly reflected by the voltage VF.

In the present embodiment, the resistance $R_{1441}$ of the resistor 1441 may be 4 megaohm, the resistance $R_{110}$ of the fuse element 110 may be 5 megaohm before the fuse element 110 is programmed, and the resistance $R_{110}$ of the fuse element 110 may become 100 kiloohm after the fuse element 110 is programmed. In such case, since the fuse element 110 has been programmed in the previous period T1, the voltage VF would be 0.029V and the latch 120 will latch the data signal $SIG_D$ to the logic high voltage level. However, if the fuse element 110 has not been programmed, then the voltage VF would be 0.67V and the latch 120 will latch the data signal $SIG_D$ to the logic low voltage level. Therefore, the status of the fuse element 110 can be identified according to the voltage level of the data signal $SIG_D$.

However, in some other embodiments, the resistance $R_{110}$ of the fuse element 110 may be less than 5 megaohm, for example, 1.5 megaohm, before it is programmed, and may become 100 kiloohm after being programmed. As a result, the voltage VF will be 0.33V if the fuse element 110 is not programmed and will be 0.029V if the fuse element 110 is programmed. Since the voltage VF is less than 0.6V in both cases, the latch 120 will latch the data signal $SIG_D$ to the logic high voltage level regardless of whether the fuse element 110 has been programmed or not. In such case, the resistor 1441 of the bonding option unit 1401 may not be a good reference for identifying the status of the fuse element 110, and another bonding option unit having a resistor of less resistance may be adopted.

To ensure that the results of the read operations can reflect the statuses of the fuse elements 110, different fuse elements 110 may adopt different bonding option units for different resistances. In some embodiments, a test operation may be performed to find the proper bonding option unit having suitable resistance by performing read operations with different bonding option units.

Furthermore, in the present embodiment, the program voltage pad PP1 and the resistor selection pads PS1 to PSN can be probe pads that can receive voltages from a probe card so that the program operation and the read operation can be performed on the fuse element 110 during a wafer probing process. That is, the proper bonding option unit can be determined and selected before the chip of the electronic fuse control circuit 100 is packaged. In such case, after the proper bonding option unit is selected, the corresponding resistor selection pad that is coupled to the selected bonding option unit can be bonded to the bonding pad of a packaging substrate during the packaging process, and the rest of the resistor selection pads may be left unbonded after the packaging process. As a result, chips of different electronic fuse control circuits 100 can have different bonding options, thereby ensuring the read operations can be performed accurately and avoiding additional manufacturing processes required to change the reference resistor in the prior art.

Figure 7:
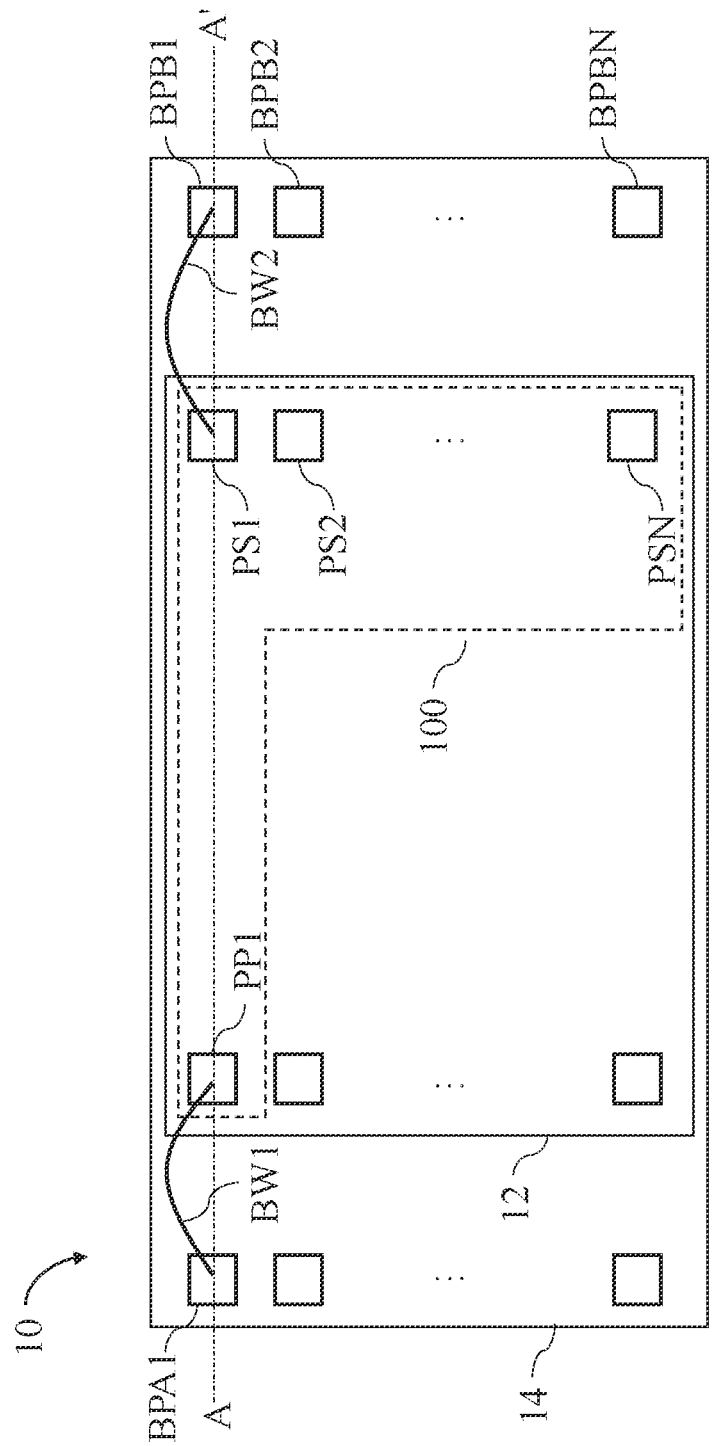
FIG. 7 shows a top view of a semiconductor device according to one embodiment of the present disclosure.
Figure 8:
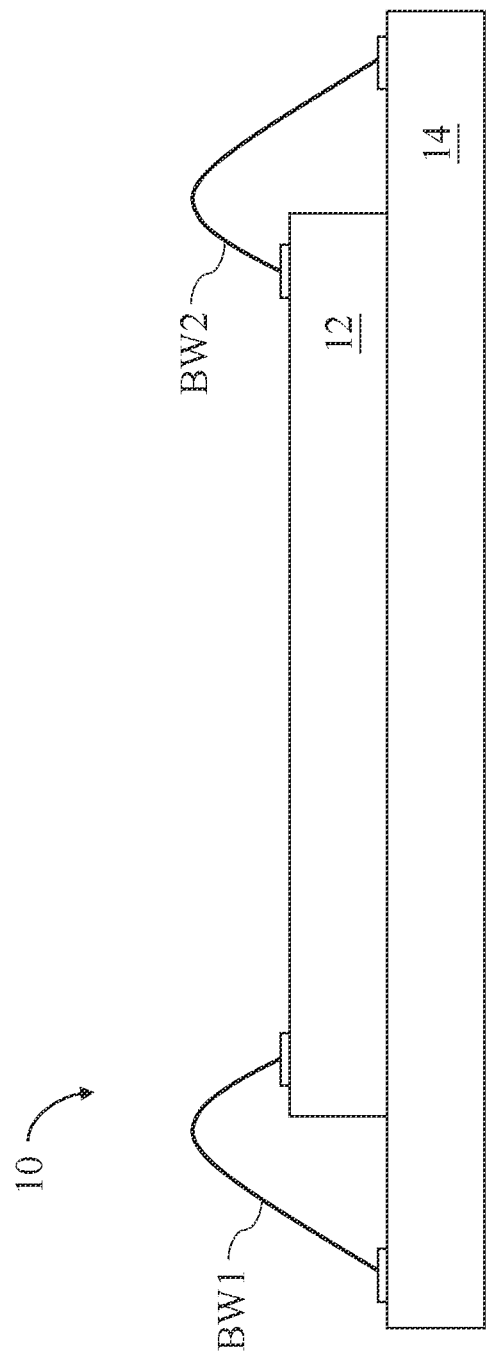
FIG. 8 shows a cross-sectional view of the semiconductor device in FIG. 7.

FIG. 7 shows a top view of a semiconductor device 10 according to one embodiment of the present disclosure, and FIG. 8 shows a cross-sectional view of the semiconductor device 10 along a line A-A' shown in FIG. 7. The semiconductor device 10 includes a chip 12 and a substrate 14. The chip 12 includes the electronic fuse control circuit 100. In some embodiments, the chip 12 may further include other circuits, and the fuse element 110 of the electronic fuse control circuit 100 can be used as a storage or an electronic identifier for the other circuits. For example, the chip 12 may further include a dynamic random-access memory (DRAM), and the fuse element 110 of the electronic fuse control circuit 100 can be used as an identifier of the DRAM. In some embodiments, the chip 12 may further include additional electronic fuse control circuits 100 for storing more bits of data according to the system requirements.

The substrate 14 includes a first voltage bonding pad BPA1 and a plurality of second voltage bonding pads BPB1 to BPBN, and the chip 12 can be disposed on the substrate 14. In the present embodiment, the first voltage bonding pad BPA1, the second voltage bonding pads BPB1 to BPBN, the program voltage pad PP1, and the resistor selection pads PS1 to PSN all face upward, so the first voltage bonding pad BPA1 and the second voltage bonding pads BPB1 to BPBN can be connected to the program voltage pad PP1 and the resistor selection pads PS1 to PSN through corresponding bonding wires.

For example, as shown in FIG. 7, the first voltage bonding pad BPA1 is bonded to the program voltage pad PP1 through a bonding wire BW1, and the second voltage bonding pad BPB1 can be bonded to the resistor selection pad PS1 through a bonding wire BW2. In such case, the second voltage bonding pad BPB1 can receive the read voltage VR during the read operation, and the bonding option unit 1401 coupled to the resistor selection pad PS1 will be used to perform the read operations. Furthermore, since the second voltage bonding pads BPB2 to BPBN are not bonded to the resistor selection pads PS2 to PSN, the bonding option units 1402 to 140N will not be adopted during the read operations.

However, in some other embodiments, if the bonding option unit 1402 is selected to perform the read operation, then the second voltage bonding pad BPB2 will be bonded to the resistor selection pad PS2 while the second voltage bonding pad BPB1 may not be bonded to the resistor selection pad PS1. That is, the electronic fuse control circuit 100 allows a user to select a proper bonding option unit from the bonding option units 1401 to 140N according to a testing result of a wafer probing process, and the selected bonding option unit can be connected to the bonding pad of the substrate by a bonding wire during a subsequent packaging process. Therefore, even though the resistance of the fuse element 110 of the electronic fuse control circuit 100 may be unpredictable, the manufacturer can select the proper bonding option unit that has a suitable resistance after the chip 10 is manufactured so as to ensure accuracy of the read operations.

Figure 9:
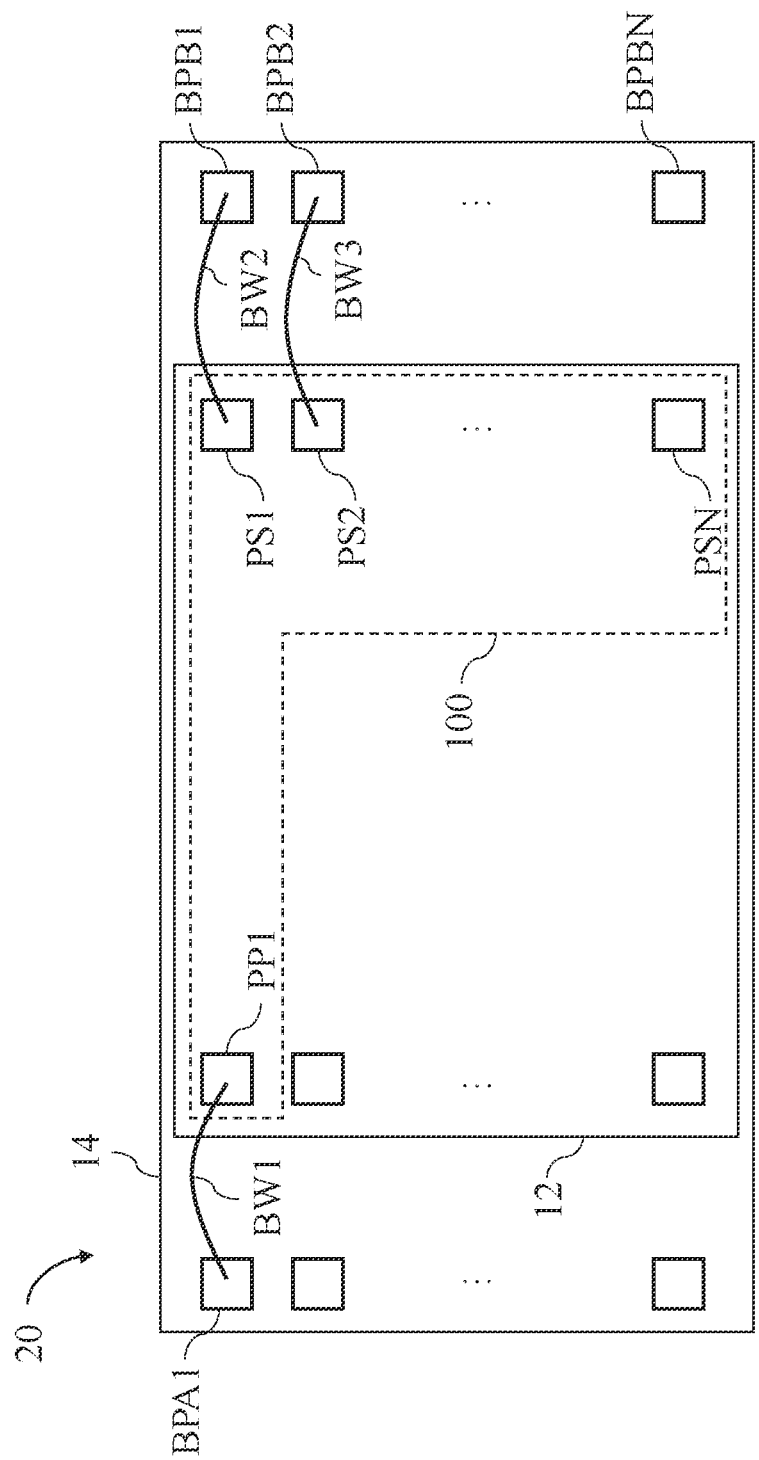
FIG. 9 shows a top view of a semiconductor device according to another embodiment of the present disclosure.

Furthermore, in some embodiments, resistors in different bonding option units may be coupled in parallel and may be used in combination for the read operations, thereby providing even more options of resistance level. FIG. 9 shows a top view of a semiconductor device 20 according to another embodiment of the present disclosure. The semiconductor device 20 and the semiconductor device 10 have similar structures and can be operated according to the same principles. However, in the semiconductor device 20, the second voltage bonding pad BPB1 is bonded to the resistor selection pad PS1 through the bonding wire BW2 and the second voltage bonding pad BPB2 is bonded to the resistor selection pad PS2 through a bonding wire BW3. In such case, during the read operation, the second voltage bonding pads BPB1 and BPB2 can both receive the read voltage VR, and the selection switches 1421 and 1422 of the bonding option units 1401 and 1402 can both be turned on. As a result, the resistors 1441 and 1442 can be coupled in parallel to serve as one reference resistor to generate the divisional voltage VF with the fuse element 110. That is, resistors of the bonding option units 1401 to 140N can be adopted individually or in combination; therefore, the bonding option units 1401 to 140N are able to provide up to $(2^N-1)$ options of different resistances.

Figure 10:
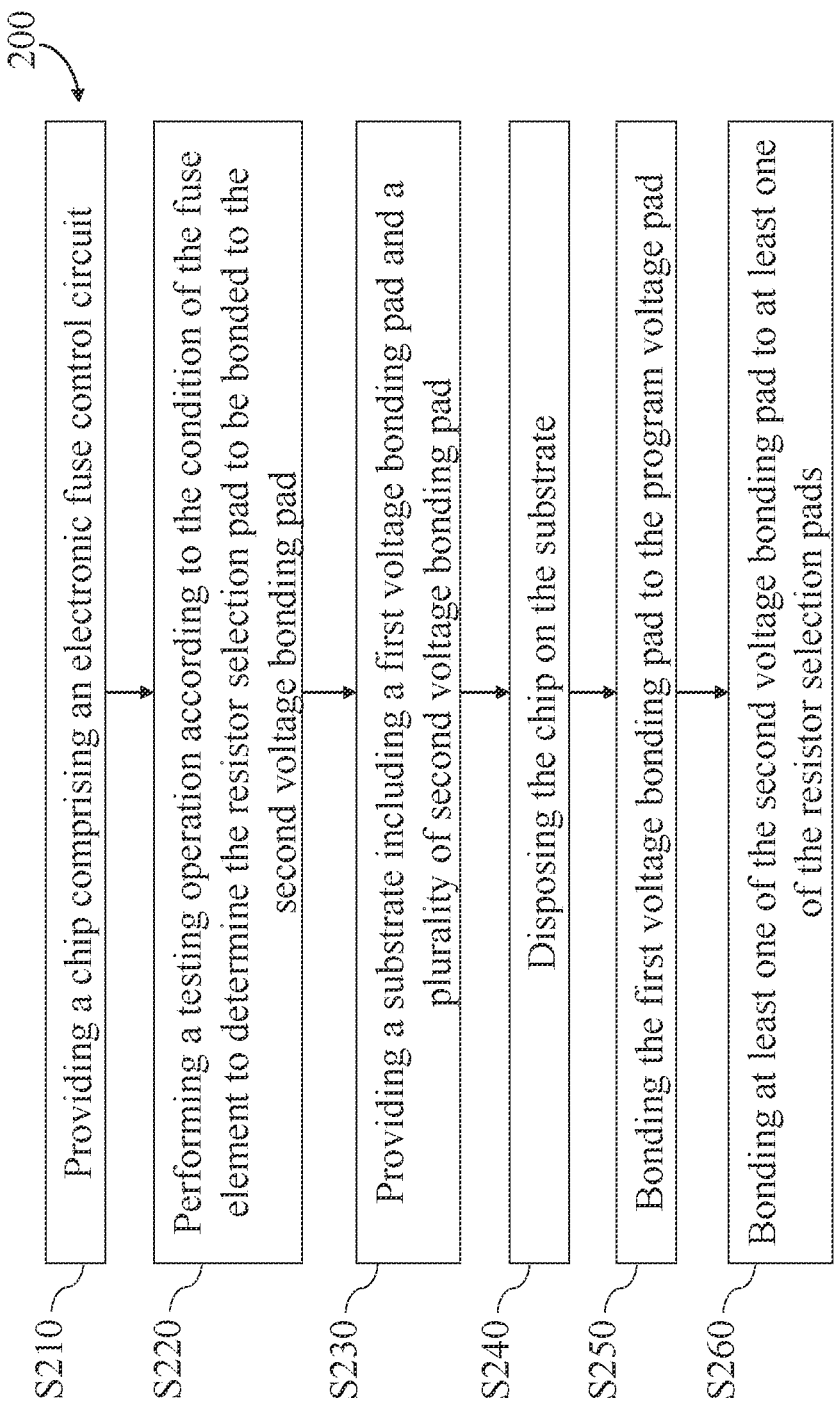
FIG. 10 shows a flowchart of a method for preparing a semiconductor device according to one embodiment of the present disclosure.

FIG. 10 shows a flowchart of a method 200 for forming a semiconductor device 10 according to one embodiment of the present disclosure. The method 200 includes steps S210 to S260. In step S210, the chip 12 including the electronic fuse control circuit 100 is provided, and the test operation is performed on the fuse element 110 of the electronic fuse control circuit 100 in step S220. In the present embodiment, the test operation is performed according to the condition of the fuse element 110 for determining the resistor selection pad(s) to be bonded to the second voltage bonding pad(s). After determining the resistor selection pad(s) to be bonded to the second voltage bonding pad(s), the substrate 14 is provided in step S230, and the chip 12 is disposed on the substrate 14 in step S240. Furthermore, the first voltage bonding pad BPA1 is bonded to the program voltage pad PP1 in step S250, and, in step S260, at least one of the second voltage bonding pads BPB1 to BPBN is bonded to the resistor selection pad determined and selected in step S220.

Figure 11:
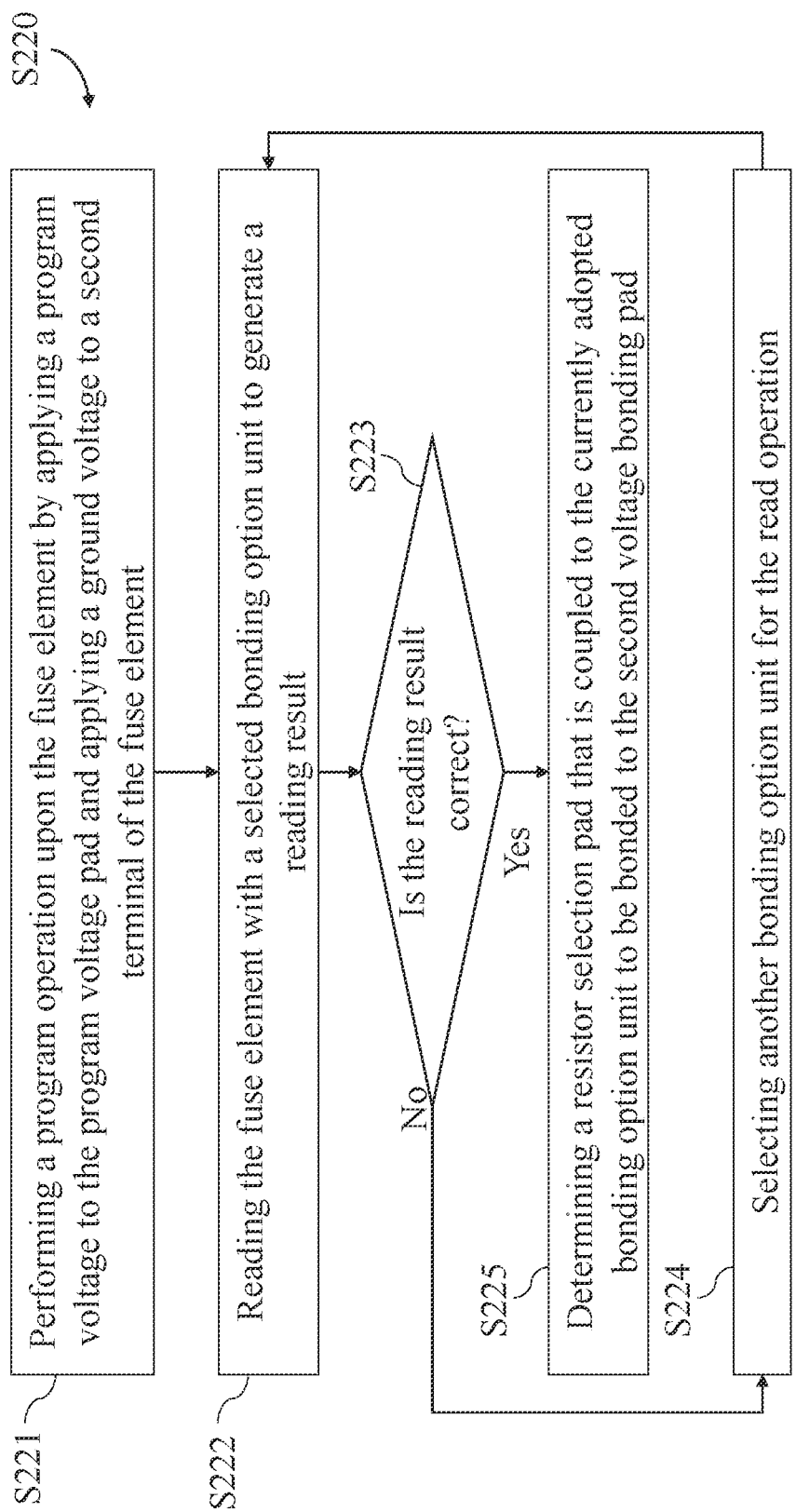
FIG. 11 shows steps for performing a test operation according to one embodiment of the present disclosure.

FIG. 11 shows sub-steps of step S220 for performing the test operation according to one embodiment of the present disclosure. As shown in FIG. 11, step S220 includes steps S221 to S225. In step S221, a program operation is performed on the fuse element 110 by applying the program voltage VP to the program voltage pad PP1 and applying the ground voltage to the second terminal of the fuse element 110. However, in some embodiments, according to the data to be stored, the fuse element 110 may be intended to remain unprogrammed. In such case, step S221 may be omitted and the fuse element 110 will remain unprogrammed. Next, a read operation is performed on the fuse element 110 with at least one bonding option unit selected from the bonding option units 1401 to 140N to generate a reading result in step S222.

Figure 12:
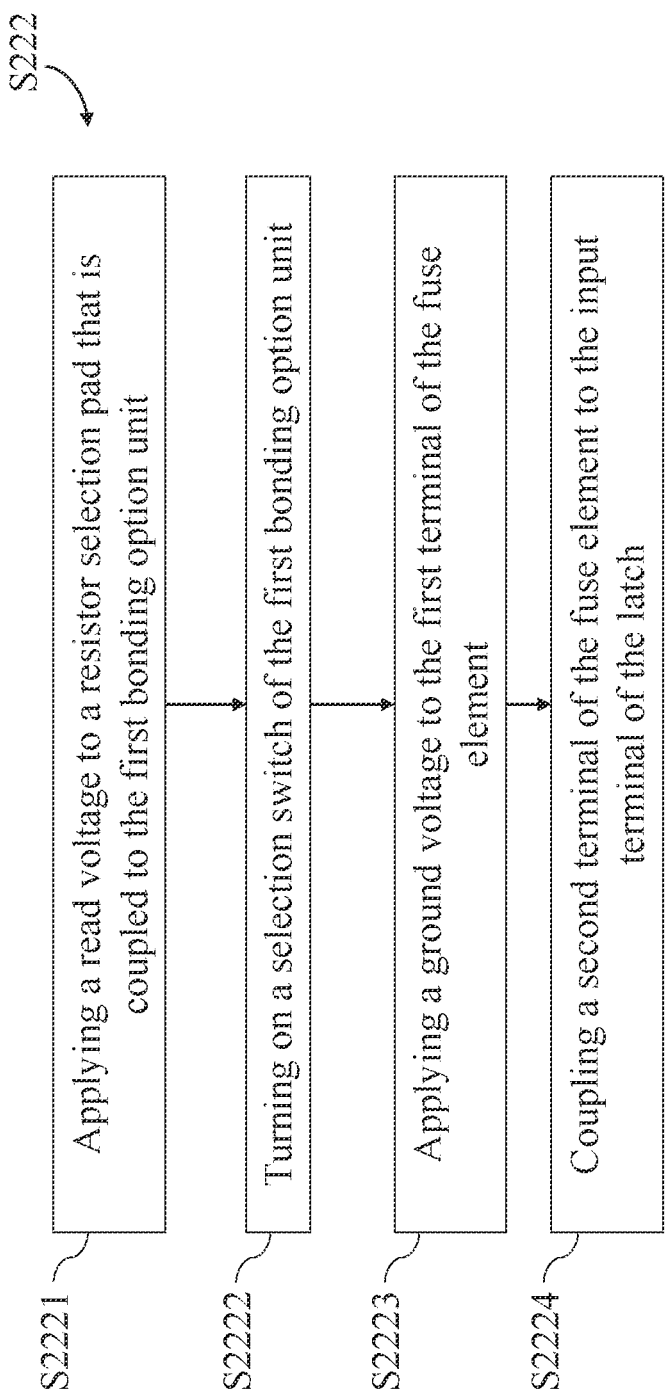
FIG. 12 shows steps for performing a read operation according to one embodiment of the present disclosure.

FIG. 12 shows steps for performing the read operation according to one embodiment of the present disclosure. As shown in FIG. 12, the read operation can include steps S2221 to S2224. In step S2221, the read voltage VR is applied to the resistor selection pad that is coupled to the bonding option unit adopted for the read operation. The selection switch of the adopted bonding option unit is turned on in step S2222, the first terminal of the fuse element 110 is pulled to the ground voltage in step S2223, and the second terminal of the fuse element 110 is coupled to the input terminal of the latch 120 in step S2224. In some embodiments, steps S2222 to S2224 can be performed by controlling the read switch 150 and the switches of the operation switch unit 130. As a result, the divisional voltage VF of the read voltage VR can be produced according to the ratio of the resistance of the resistor of the adopted bonding option unit to the resistance the fuse element 110, and the latch 120 can latch the data signal $SIG_D$ according to the divisional voltage VF.

In the present embodiment, since the status of the fuse element 110 is known before the test operation is performed, an expected reading result is also available. For example, if the fuse element 110 has been programmed, a signal data $SIG_D$ having the logic high voltage level may be expected. However, if the fuse element 110 has not been programmed, a signal data $SIG_D$ having the logic high voltage level may be unexpected.

In step S223, the reading result can be compared to the expected result to determine whether the currently selected bonding option unit is suitable or not. If the reading result is determined to be negative, that is, the reading result does not match the expected status of the fuse element 110, such reading result may imply that the bonding option unit selected in step S221 is not a proper choice. In such case, another bonding option unit is selected in step S224, and step S222 is performed again with a newly selected bonding option unit. However, if the reading result is determined to be affirmative, then the bonding option unit currently adopted for the read operation is determined to be the proper choice and selected. In such case, the resistor selection pad coupled to the selected bonding option unit is determined to be the one to be bonded to the corresponding second voltage bonding pad in step S225, and the resistor selection pad determined or selected by the test operation is bonded to the corresponding second voltage bonding pad in step S260.

In the present embodiment, the test operation can be performed by wafer probing before the chip 12 is packaged; therefore, the resistor selection pad and the second voltage bonding pad can be bonded later in the packaging process after the proper bonding option unit is selected, thereby ensuring the read operations can be performed accurately and avoiding additional manufacturing processes required to change the reference resistor in the prior art.

In summary, the electronic fuse control circuits, the semiconductor devices, and the methods for forming the semiconductor devices provided by the embodiments of the present disclosure allow a user to select a proper bonding option unit during a wafer probing process, and the user can subsequently connect the selected bonding option unit to a bonding pad of a substrate during a packaging process. Therefore, even though a resistance of a fuse element cannot be predicted before a chip is manufactured, a manufacturer is able to select the proper bonding option unit that has suitable resistance after the chip is manufactured so as to ensure accuracy of read operations and avoid additional manufacturing processes required to change a reference resistor in the prior art.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method for preparing a semiconductor device, comprising:
   providing a chip comprising an electronic fuse control circuit, wherein the electronic fuse control circuit comprises a program voltage pad, a fuse element, a latch, a plurality of resistor selection pads, and a plurality of bonding option units, the program voltage pad is coupled to a first terminal of the fuse element, and each of the plurality of bonding option units comprises a resistor and a selection switch coupled in series between an input terminal of the latch and a corresponding resistor selection pad of the plurality of resistor selection pads;
   providing a substrate comprising a first voltage bonding pad and a plurality of second voltage bonding pads;
   disposing the chip on the substrate;
   bonding the first voltage bonding pad to the program voltage pad; and
   bonding at least one of the plurality of second voltage bonding pads to at least one of the plurality of resistor selection pads.

2. The method of claim 1, further comprising:
   performing a test operation according to a condition of the fuse element to determine the at least one of the plurality of resistor selection pads to be bonded to the at least one of the plurality of second voltage bonding pads.

3. The method of claim 2, wherein performing the test operation according to the condition of the fuse element to determine the at least one resistor selection pad to be bonded to the at least one of the plurality of second voltage bonding pad comprises:

reading the fuse element with a first bonding option unit of the plurality of bonding option units to generate a first reading result; and when the first reading result is determined to be negative, performing a read operation on the fuse element with a second bonding option unit of the plurality of bonding option units to generate a second reading result.

4. The method of claim 3, wherein performing the test operation according to the condition of the fuse element to determine the at least one resistor selection pad to be bonded to the at least one of the plurality of second voltage bonding pads further comprises:

when the second reading result is determined to be affirmative, determining a resistor selection pad that is coupled to the second bonding option unit to be bonded to the at least one second voltage bonding pad.

5. The method of claim 3, wherein performing the read operation on the fuse element with the first bonding option unit of the plurality of bonding option units to generate the first reading result comprises:

applying a read voltage to a resistor selection pad that is coupled to the first bonding option unit;

turning on a selection switch of the first bonding option unit;

applying a ground voltage to the first terminal of the fuse element; and coupling a second terminal of the fuse element to the input terminal of the latch.

6. The method of claim 3, wherein performing the test operation further comprises:

performing, before the read operation is performed on the fuse element, a program operation on the fuse element by applying a program voltage to the program voltage pad and applying a ground voltage to a second terminal of the fuse element.

* * * * *